(12) United States Patent
Hwang et al.

(10) Patent No.: US 9,085,049 B2
(45) Date of Patent: Jul. 21, 2015

(54) METHOD AND SYSTEM FOR MANUFACTURING SEMICONDUCTOR DEVICE

(71) Applicant: Taiwan Semiconductor Manufacturing Company, Ltd., Hsinchu (TW)

(72) Inventors: Chien-Ling Hwang, Hsinchu (TW); Bor-Ping Jang, Hsinchu (TW); Yi-Li Hsiao, Hsinchu (TW); Hsin-Hung Liao, Hsinchu (TW); Chung-Shi Liu, Hsinchu (TW)

(73) Assignee: Taiwan Semiconductor Manufacturing Company, Ltd., Hsinchu (TW)

( * ) Notice: Subject to any disclaimer, the term of this patent is extended or adjusted under 35 U.S.C. 154(b) by 134 days.

(21) Appl. No.: 13/691,561

(22) Filed: Nov. 30, 2012

(65) Prior Publication Data
US 2014/0154871 A1   Jun. 5, 2014

(51) Int. Cl.
*B23K 26/14*    (2014.01)
*B23K 26/36*    (2014.01)
*B23K 26/38*    (2014.01)
*H01L 21/78*    (2006.01)
*B23K 26/40*    (2014.01)
*H01L 21/30*    (2006.01)
*H01L 21/26*    (2006.01)

(52) U.S. Cl.
CPC .................. *B23K 26/38* (2013.01); *B23K 26/14* (2013.01); *B23K 26/1417* (2013.01); *B23K 26/36* (2013.01); *B23K 26/4075* (2013.01); *H01L 21/78* (2013.01); *B23K 2201/40* (2013.01); *H01L 21/26* (2013.01); *H01L 21/30* (2013.01)

(58) Field of Classification Search
CPC ............... B23K 26/00; B23K 26/0006; B23K 26/0021; B23K 26/0039; B23K 26/0042; B23K 26/14; B23K 26/36; H01L 30/00; H01L 46/00; H01L 78/00; H01L 21/26; H01L 21/30
USPC ............ 219/121.67–121.72, 121.84; 438/463
See application file for complete search history.

(56) References Cited

U.S. PATENT DOCUMENTS

| | | | | |
|---|---|---|---|---|
| 6,649,866 | B2* | 11/2003 | Reichmann et al. | 219/121.84 |
| 6,720,522 | B2* | 4/2004 | Ikegami et al. | 219/121.69 |
| 7,829,817 | B2* | 11/2010 | Zakel et al. | 219/121.6 |
| 2002/0122090 | A1* | 9/2002 | Sharma et al. | 347/28 |
| 2004/0197433 | A1* | 10/2004 | Terada et al. | 425/174.4 |
| 2008/0067159 | A1* | 3/2008 | Zhang et al. | 219/121.84 |
| 2011/0222037 | A1* | 9/2011 | Kiuchi et al. | 355/53 |

FOREIGN PATENT DOCUMENTS

JP     2006007312 A  *  1/2006

* cited by examiner

*Primary Examiner* — Samuel M Heinrich
(74) *Attorney, Agent, or Firm* — McDermott Will & Emery LLP

(57) ABSTRACT

A method for manufacturing a semiconductor device is provided. The method contains steps of providing the semiconductor device including a working area; directing a medium flow onto the working area; configuring a lens in contact with the medium flow; and directing a laser beam to the working area through the lens and the medium flow. A laser processing for manufacturing a semiconductor device is also provided.

20 Claims, 5 Drawing Sheets

METHOD AND SYSTEM FOR MANUFACTURING SEMICONDUCTOR DEVICE

TECHNICAL FIELD

The present disclosure relates to a method and a system for manufacturing semiconductor devices, and more particularly to a method and a system for manufacturing semiconductor devices by using a laser processing system.

BACKGROUND

Since laser beam machining is capable of delineating fine patterns of an order of a micron (μm) without requiring a lithography process, it has been attracting a great deal of attention as an approach to manufacturing semiconductor devices. In producing semiconductor devices, various types of layers, such as resist layers, resin layers, insulating layers, metal layers, etc. are formed and laminated on a wafer. Fine machining is needed not only for forming VIA holes, circuit patterns, and interconnections in the laminated layers, but also for grooving wafers for, e.g., the purpose of promoting wafer sawing.

Wafer sawing is performed by a combination of the laser grooving process and mechanical diamond blade dicing to prevent peeling problems, which cannot be addressed by a standard blade dicing process alone. The action of groove definition via the laser grooving process generally results in debris such as silicon debris on the wafer surface and groove sidewalls that contain undesirable crystal imperfections. Accordingly, in the traditional laser grooving process, a step of cleaning grooves scribed by a laser scriber with an etchant comprising a base and peroxide mixture, an acid and peroxide mixture, a NaOH solution, or several other solutions known and used in the art to remove debris from the grooves and the top surface of the wafer is required. However, this etching step must be done carefully to avoid removal of all the top surface oxide. Further, it is difficult to entirely remove the accumulated debris by the standard cleaning methods. It is also known to coat a protective material on the surface of the wafer prior to the laser grooving process to prevent the adherence of the debris. However, additional processes, such as for covering the active areas and the bumps on the wafer with the protective material and for removing the protective material on the wafer, are required.

Excimer lasers have been considered poor choices as exposure radiation sources for machining metals due to the generation of severe recast and debris during the laser interaction. High repetition rate, Q-switched YAG lasers also generate a recast and debris field when machining metals. These YAG lasers may be focused to a small spot and rastered over the area to be cut so that the generation of recast and debris may be somewhat tempered. However, the generation of recast and debris using a YAG laser in this way will still not be eliminated or even suppressed below a sufficient tolerance level.

Hence, because of the defects in the prior arts, there is a need to solve the above problems.

SUMMARY

In accordance with one aspect of the present disclosure, a laser processing system for manufacturing a semiconductor device including a working area is provided. The system comprises a laser beam outlet providing therethrough a laser beam to the working area; and a medium providing device including a first passage, a second passage and a bridging part connected therebetween for providing a medium onto the working area via the first passage and collecting the medium from the working area via the second passage to form a medium flow on the working area, wherein the bridging part is connected with the laser beam outlet.

In accordance with another aspect of the present disclosure, a method for manufacturing a semiconductor device is provided. The method comprises steps of providing the semiconductor device including a working area; directing a medium flow onto the working area; configuring a lens in contact with the medium flow; and directing a laser beam to the working area through the lens and the medium flow.

In accordance with one more aspect of the present disclosure, a laser processing system for manufacturing a semiconductor device having a working area is provided. The system comprises a medium control device including a first passage and a second passage for directing a medium flow onto the working area; and a laser device providing a laser beam to the working area through the medium flow, wherein when observed from either side of the laser beam, the medium flow in the first passage has a flow direction different from that of the medium flow in the second passage.

The present disclosure may best be understood through the following descriptions with reference to the accompanying drawings, in which:

DETAILED DESCRIPTION

Figure 1:
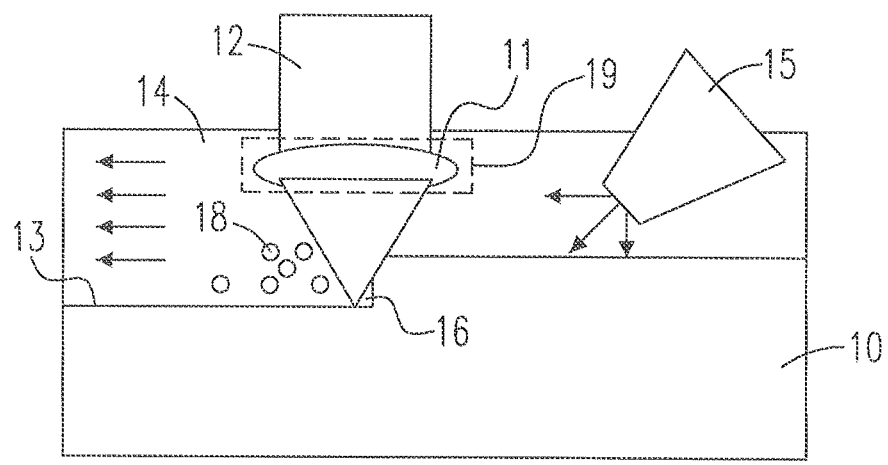
FIG. 1 is a diagram showing a system for manufacturing a semiconductor device according to various embodiments of the present disclosure.

The present disclosure will be described with respect to particular embodiments and with reference to certain drawings, but the disclosure is not limited thereto but is only limited by the claims. The drawings described are only schematic and are non-limiting. In the drawings, the size of some of the elements may be exaggerated and not drawn on scale for illustrative purposes. The dimensions and the relative dimensions do not necessarily correspond to actual reductions to practice.

Furthermore, the terms first, second and the like in the description and in the claims, are used for distinguishing between similar elements and not necessarily for describing a sequence, either temporally, spatially, in ranking or in any other manner. It is to be understood that the terms so used are interchangeable under appropriate circumstances and that the embodiments described herein are capable of operation in other sequences than described or illustrated herein.

It is to be noticed that the term "comprising", used in the claims, should not be interpreted as being restricted to the means listed thereafter; it does not exclude other elements or steps. It is thus to be interpreted as specifying the presence of the stated features, integers, steps or components as referred to, but does not preclude the presence or addition of one or more other features, integers, steps or components, or groups thereof. Thus, the scope of the expression "a device comprising means A and B" should not be limited to devices consisting only of components A and B.

Reference throughout this specification to "one embodiment" or "an embodiment" means that a particular feature, structure or characteristic described in connection with the embodiment is included in at least one embodiment. Thus, appearances of the phrases "in one embodiment" or "in an embodiment" in various places throughout this specification are not necessarily all referring to the same embodiment, but may. Furthermore, the particular features, structures or characteristics may be combined in any suitable manner, as would be apparent to one of ordinary skill in the art from this disclosure, in one or more embodiments.

Similarly it should be appreciated that in the description of exemplary embodiments, various features are sometimes grouped together in a single embodiment, figure, or description thereof for the purpose of streamlining the disclosure and aiding in the understanding of one or more of the various inventive aspects. This method of disclosure, however, is not to be interpreted as reflecting an intention that the claimed invention requires more features than are expressly recited in each claim. Rather, as the following claims reflect, inventive aspects lie in less than all features of a single foregoing disclosed embodiment. Thus, the claims following the detailed description are hereby expressly incorporated into this detailed description, with each claim standing on its own as a separate embodiment.

Furthermore, while some embodiments described herein include some but not other features included in other embodiments, combinations of features of different embodiments are meant to be within the scope of the invention, and form different embodiments, as would be understood by those in the art. For example, in the following claims, any of the claimed embodiments can be used in any combination.

In the description provided herein, numerous specific details are set forth. However, it is understood that embodiments may be practiced without these specific details. In other instances, well-known methods, structures and techniques have not been shown in detail in order not to obscure an understanding of this description.

The present disclosure will now be described by a detailed description of several embodiments. It is clear that other embodiments can be configured according to the knowledge of persons skilled in the art without departing from the true technical teaching of the present disclosure, the claimed invention being limited only by the terms of the appended claims.

Please refer to FIG. 1, which is a diagram showing a system for manufacturing a semiconductor device according to various embodiments of the present disclosure. The system is a laser processing system for conducting a laser grooving process, for example, and the semiconductor device could be a wafer 10 or any component suitable to be processed by the laser processing system. The laser processing system comprises a laser beam outlet 19 and a laser device (not shown) providing a laser beam 12 through the laser beam outlet 19 to the wafer 10. The material of the semiconductor device can absorb laser energy and sublime when heated by the laser beam 12. The laser beam outlet 19 may comprise a lens 11 that can be a focusing or imaging lens configured in the laser device and focuses the laser beam 12 onto a surface 13 of the wafer 10. Alternatively, the abovementioned lens 11 may be disposed in a place outside of the laser device through which the laser beam 12 provided by the laser device is focused onto the surface 13. When the lens 11 is disposed outside of the laser device, in addition to the lens 11, the laser beam outlet 19 may further comprise a lens holder (not shown) for keeping the lens 11 in position.

The laser processing system in FIG. 1 further comprises a medium providing device for providing a medium flow 14 forming a protective layer onto the wafer 10, wherein the arrows in FIG. 1 denote flow direction of the medium flow 14. The medium constituting the medium flow 14 may be organic or inorganic liquid, e.g. water, an inert liquid, or other liquid that is substantially reactive free with the semiconductor device to be processed. Further, the medium has a density that is high enough to carry away volatile or suspended matter generated during the laser process. The medium providing device in FIG. 1 may comprise a nozzle 15 for providing the medium. The nozzle 15 may be any of a variety and configured in or above the medium. As an example, the nozzle 15 is configured in the medium for generating a stable medium flow 14. The medium providing device may further comprise other components such as a pump, a filter or a reservoir for maintaining proper flowing conditions of the medium flow and a vacuum device to withdraw the medium on the wafer 10, and the abovementioned components may be computer controlled.

As shown in FIG. 1, the wafer 10 is immersed in the medium flow 14 during the laser grooving process so that when grooves 16 are formed on the wafer 10 by the laser beam 12, the generated debris 18 on the surface 13 of the wafer 10 and groove sidewalls can be washed away by the medium flow 14. That is to say, the medium flow 14 prevents the accumulation of the debris 18 during the laser grooving process, and thus the process is simplified due to the omission of the protecting film coating and the further cleaning process.

Figure 2:
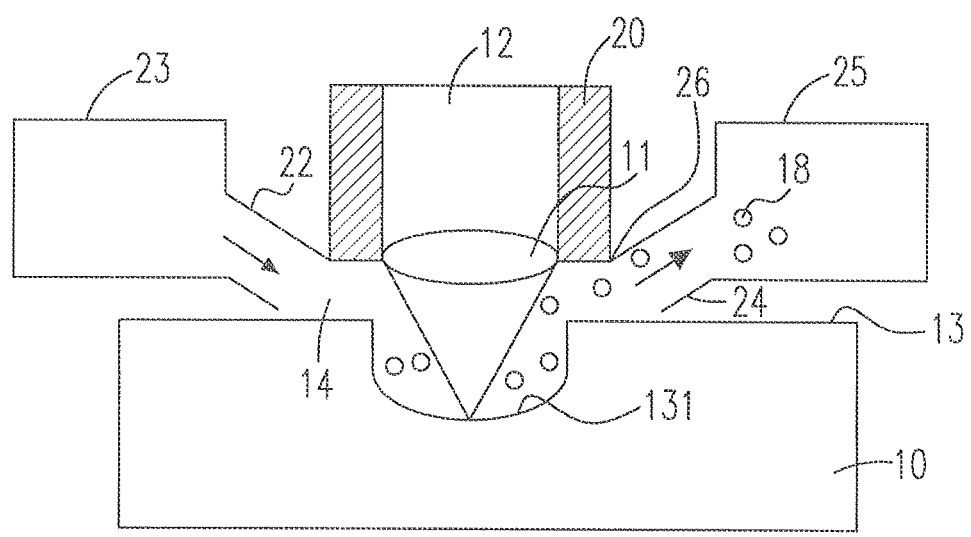
FIG. 2 is a diagram showing a system for manufacturing a semiconductor device according to various embodiments of the present disclosure.
Figure 3:
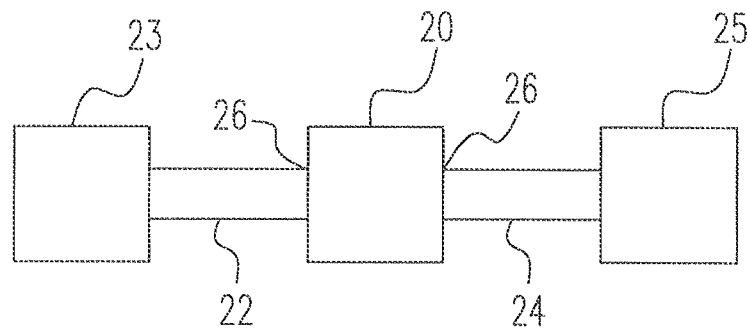
FIG. 3 is a diagram showing a top view of the system shown in FIG. 2.
Figure 4:
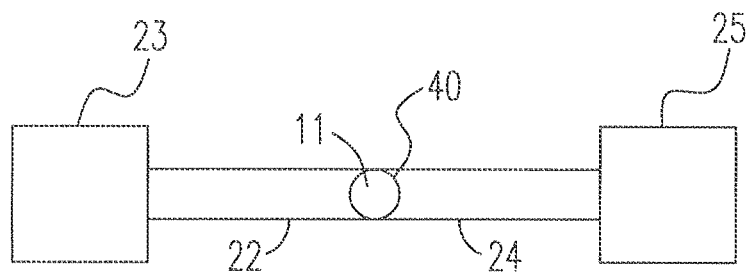
FIG. 4 is a diagram showing a top view of a system modified from the system shown in FIG. 3.

Please refer to FIG. 2, which is a diagram showing a system for manufacturing a semiconductor device according to various embodiments of the present disclosure. As shown in FIG. 2, the lens 11 is configured in the laser device 20 and in contact with the medium. Further, the medium providing device in FIG. 2 comprises a first passage 22, a second passage 24 and a bridging part 26 connected therebetween for providing the medium onto a working area 131 via the first passage 22 and collecting the medium along with the generated debris from the working area 131 via the second passage 24 to form the medium flow 14 with a flow direction denoted by the arrows on the wafer 10, particularly the working area 131. The working area 131 may be a portion of the surface 13 on the wafer 10, and the laser beam 12 is directed through the laser beam outlet, which includes the lens 11 disposed in the laser device 20, to the working area 131. The flow of the medium over the working area 131 has the added benefit of cooling the material, particularly the material within the working area 131, being laser machined for greatly reducing the heat-affected zone. As shown in FIG. 3, which is a top view of the laser processing system in FIG. 2, the bridging part 26 connects the laser device 20 with the first passage 22 and the second passage 24. In another example, the bridging part 26 may include a hole 40, and the laser beam outlet, which may include the lens 11 disposed outside of the laser device 20, is directly configured in the hole 40, as shown in FIG. 4. In this regard, it may not be necessary to include a lens holder in the system.

Figure 5:
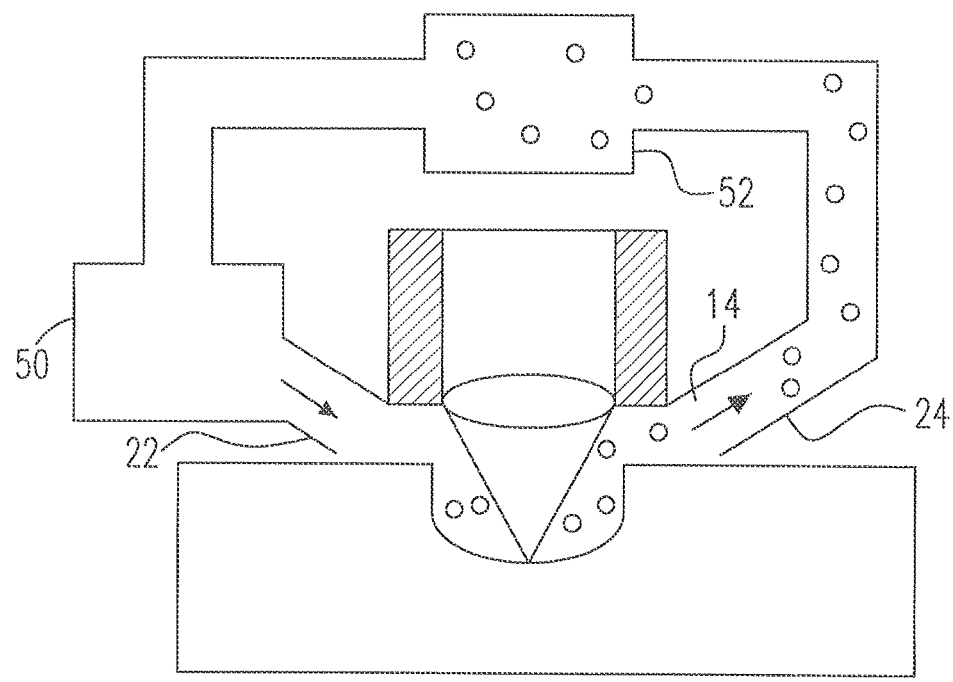
FIG. 5 is a diagram showing a system for manufacturing a semiconductor device according to various embodiments of the present disclosure.

The system shown in FIG. 2 may further comprise a first reservoir 23 connected with the first passage 22 and a second reservoir 25 connected with the second passage 24 for providing and collecting the medium, respectively. As an example, the system may further comprise a channel configured between the first reservoir 23 and the second reservoir 25 for recycling the collected medium and a filter configured in the channel for filtering out the debris and particles. One such configuration of a system for manufacturing a semiconductor device according to various embodiments of the present disclosure is shown in FIG. 5. Both of the first passage 22 and the second passage 24 may be connected with the same medium reservoir 50, and a filter 52 may be configured between the medium reservoir 50 and the second passage 24 so that the medium recirculated into the medium reservoir 50 is recycled.

Figure 6:
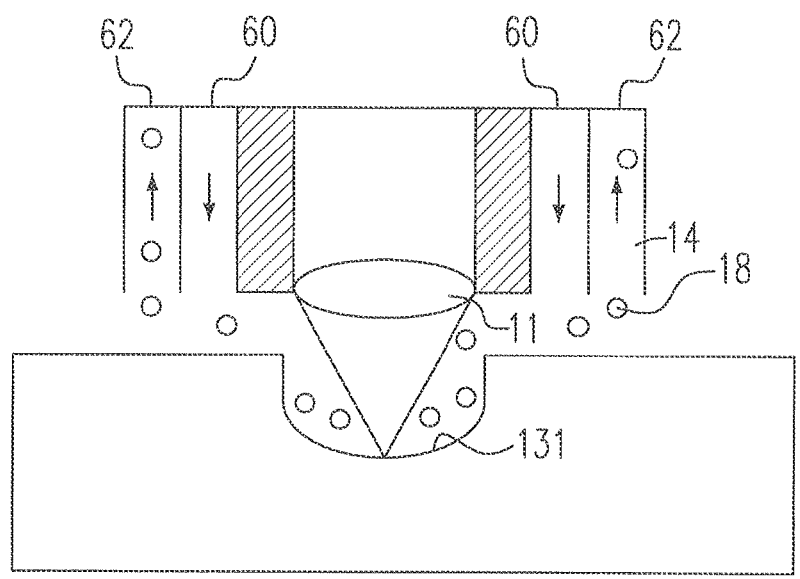
FIG. 6 is a diagram showing a system for manufacturing a semiconductor device according to various embodiments of the present disclosure.

Please refer to FIG. 6, which is a diagram showing a system for manufacturing a semiconductor device according to various embodiments of the present disclosure. In FIG. 6, the medium providing device comprises an inner channel 60 and an outer channel 62, which are coaxial channels, and the inner channel 60 which the laser beam passes through is configured within the outer channel 62. The medium flow 14 in the inner channel 60 has a flow direction different from that of the medium flow 14 in the outer channel 62, as indicated by the arrows in FIG. 6. Namely, either the inner channel 60 or the outer channel 62 could supply the medium onto the working area 131, and the other could collect the medium along with the debris 18 on the working area 131. As an example, the inner channel 60 and the outer channel 62 may be substantively perpendicular to the working area 131 and the medium flows therein may have the same flow rate. As shown in FIG. 6, the laser device may be configured within the inner channel 60, or selectively, the laser device could be disposed outside of the inner channel 60 and provide the laser beam through the inner channel 60 to the lens 11 either inside or outside the inner channel 60.

Figure 7:
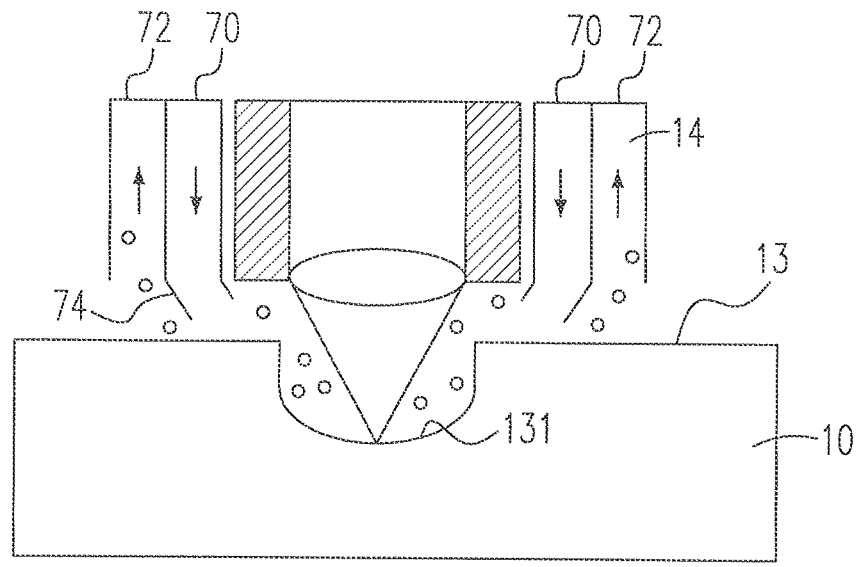
FIG. 7 is a diagram showing a system for manufacturing a semiconductor device according to various embodiments of the present disclosure.

Please refer to FIG. 7, which is a diagram showing a system for manufacturing a semiconductor device according to various embodiments of the present disclosure. Modified from the system shown in FIG. 6, the medium providing device comprises one or more sets of an inner channel 70 and an outer channel 72 configured beside the inner channel 70, which are substantively perpendicular to the working area 131. Two sets of the inner channel 70 and the outer channel 72 configured in either side of the laser device are exemplarily shown in FIG. 7. The inner channel 70 may not be directly in contact with the outer channel 72. For facilitating the discharge of the medium onto the surface 13 of the wafer 10, particularly the working area 131, the channel for supplying the medium, e.g. the inner channel 70, may comprise an auxiliary unit 74 for guiding the supplied medium onto the working area 131. Namely, because of the auxiliary unit 74, the medium outlet of the inner channel 70 is closer to the working area 131 compared with the medium inlet of the outer channel 72, and accordingly the condition that the medium just supplied from the medium outlet is collected into the medium inlet without passing the working area 131 is avoided. The auxiliary unit 74 may be a conduit, a sheet or the like extended from the inner channel 70 toward the working area 131.

Figure 8:
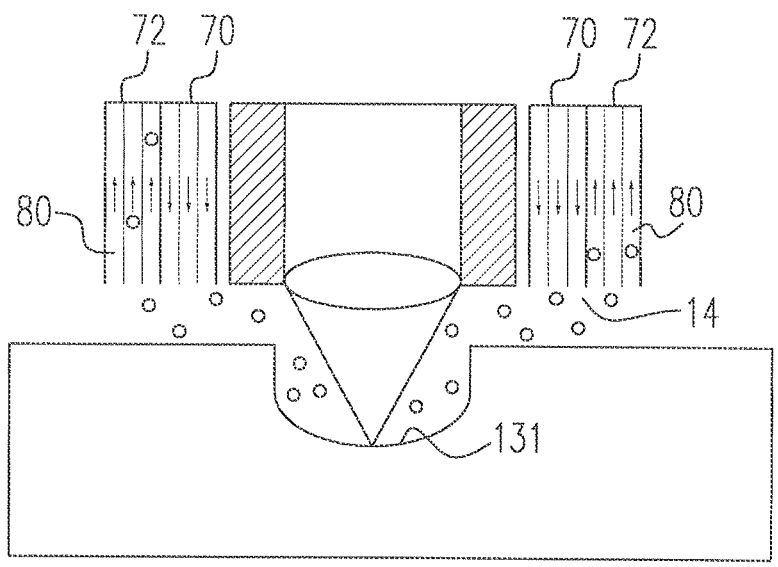
FIG. 8 is a diagram showing a system for manufacturing a semiconductor device according to various embodiments of the present disclosure.

Please refer to FIG. 8, which is a diagram showing a system for manufacturing a semiconductor device according to various embodiments of the present disclosure. Modified from the system shown in FIG. 7, the medium providing device may comprise a bundle of sub-channels 80 in each of the inner channel 70 and the outer channel 72, as shown in FIG. 8. Alternatively, a bundle of sub-channels 80 may form each of the inner channel 70 and the outer channel 72.

Figure 9:
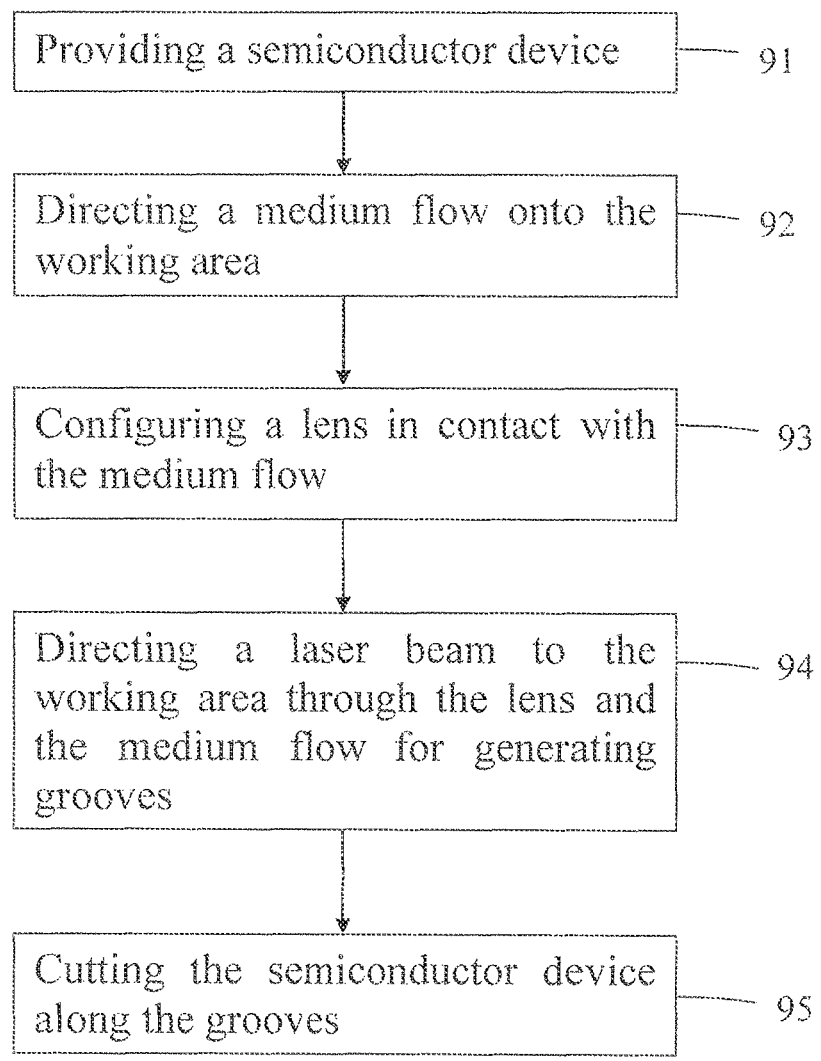
FIG. 9 is a flow chart showing a method for manufacturing a semiconductor device according to various embodiments of the present disclosure.

Please refer to FIG. 9, which is a flow chart showing a method for manufacturing a semiconductor device according to various embodiments of the present disclosure. The method is performed by using any of the abovementioned embodiments and includes the following steps. First, a semiconductor device such as a wafer 10 including a working area 131 is provided (Step 91). Then, a medium flow 14 is directed onto the working area 131 by the manners illustrated in FIGS. 1-8 so that the wafer 10 is fully or partially immersed in the medium (Step 92). Afterwards, a laser beam outlet 19 including, e.g., a lens 11 is configured in contact with the medium flow 14 (Step 93). However, the laser beam outlet 19 also can be configured prior to the generation of the medium flow 14. Then, a laser beam is directed from a laser device 20 to the working area 131 through the lens 11 and the steady medium flow 14 for generating at least one groove 16 on the wafer 10 (Step 94). As an example, Step 92 can begin prior to or in coincidence with Step 94. The debris 18 or molten residues formed during the laser processing are carried away by the flowing medium past the surface 13 of the wafer 10 and are selectively trapped in a filter 52 during recirculation of the medium. Accordingly, the debris accumulation and contaminants can be eliminated and the equipment or process for the footprint may not be required. After the generation of the grooves 16, the wafer 10 may be diced or cut along the grooves 16 (Step 95). Based on the purpose of the laser processing, Step 95 may be omitted. Further, before Step 95, the discharge of the medium onto the wafer 10 may be ceased, and the residual medium may be removed from the wafer 10 prior to completing cut-through of the wafer 10 by the laser beam 12.

The above embodiment shows exemplary steps, but they are not necessarily required to be performed in the order shown. Steps may be added, replaced, changed in order, and/or eliminated as appropriate, in accordance with the spirit and scope of embodiments of the disclosure.

The medium flow 14 may have a flow rate in a range from about 20 to 800 ml/min, and the laser beam 12 may have a wavelength in a range from about 355 to 1064 nm, e.g. 355 nm, 532 nm and 1064 nm, and a laser power in a range from 0.5 to 200 W. Particularly, the laser beam 12 is a 355 nm UV laser generated by a UV laser device and focused or imaged onto the wafer 10 by using, e.g., a focusing or imaging lens. In addition, the lens 11 included in the laser beam outlet 19 may be configured above or on the medium flow 14, or immersed in the medium flow 14. For the examples where the lenses 11 are configured on the medium flow 14 or immersed in the medium flow 14, the interference of the medium flow 14 in the light path of the laser beam 12 might be reduced while compared with a design where the lens is configured above the medium flow 14.

Furthermore, the system for manufacturing the semiconductor device may further comprise a carrier, e.g. an X-Y-Z motion stage, for holding and moving the wafer 10 and a controller for determining the moving direction and rate of the carrier so as to create a predefined pattern on the wafer 10 by the laser beam 12. The moving rate of the carrier determines the scan speed. The scan speed and the laser power determine the depth of the grooves 16 on the wafer 10 and can be determined by one skilled in the art based on the actual demand. By the proper adjustment of the scan speed and the laser power, the wafer 10 can be diced and separated.

By using continuous flow of water or other medium in accordance with the abovementioned embodiments, the laser processing system provides a clean (debris free) workpiece, which can aid in reducing the heat accumulation near the generated grooves 16 and eliminating debris 18 generated in the ablation process, thereby eliminating or reducing the time, cost and effort otherwise typically involved in a post-cleaning process, and can increase the throughput of the laser grooving process. Further, since the wafer 10 may be partially covered by the medium flow 14, it is possible that other than the processed region, other regions of the wafer are not affected by either the laser beam or the medium. The above-mentioned embodiment may be used in many industrial applications. For example, it can be used to engrave printing plates, etch and cut microelectronic probes, create MEMS structures in metals, semiconductors, ceramics or glass and polymer insulators.

While the invention has been described in terms of what is presently considered to be the most practical and preferred embodiments, it is to be understood that the invention needs not be limited to the disclose embodiments. Therefore, it is intended to cover various modifications and similar arrangements included within the spirit and scope of the appended claims, which are to be accorded with the broadest interpretation so as to encompass all such modifications and similar structures.

What is claimed is:

1. A laser processing system for manufacturing a semiconductor device including a working area, comprising:
    a laser beam outlet providing therethrough a laser beam to the working area; and
    a medium providing device including a first passage, a second passage and a bridging part connected therebetween for providing a medium onto the working area via the first passage and collecting the medium from the working area via the second passage to form a medium flow on the working area, wherein the bridging part is connected with the laser beam outlet.

2. The system as claimed in claim 1, wherein the semiconductor device is a semiconductor wafer.

3. The system as claimed in claim 1, further comprising a laser device providing the laser beam through the laser beam outlet to the working area.

4. The system as claimed in claim 3, wherein the bridging part includes a hole, the laser beam outlet is configured in the hole and the laser beam outlet includes a lens disposed at one of places in the laser device and outside of the laser device.

5. The system as claimed in claim 1, wherein the laser beam outlet includes a lens holder for holding a lens.

6. The system as claimed in claim 1, wherein the medium is one of a water and an inert liquid.

7. A laser processing system for manufacturing a semiconductor device having a working area, comprising:
    a medium control device including a first passage and a second passage for directing a medium flow onto the working area; and
    a laser device providing a laser beam to the working area through the medium flow, wherein when observed from either side of the laser beam, the medium flow in the first passage has a flowing direction different from that of the medium flow in the second passage.

8. The laser processing system as claimed in claim 7, further comprising:
    a carrier device for carrying and moving the semiconductor device in a moving direction.

9. The laser processing system as claimed in claim 7, wherein the first and the second passages are substantially perpendicular to the working area.

10. The laser processing system as claimed in claim 7, wherein the first passage includes an inner channel and the second passage includes an outer channel, and the inner channel is configured within the outer channel.

11. The laser processing system as claimed in claim 7, wherein the first passage is configured beside the second passage.

12. The laser processing system as claimed in claim 7, wherein the first passage includes a medium outlet, the second passage includes a medium inlet, and the medium outlet is closer to the working area while compared with the medium inlet.

13. The laser processing system as claimed in claim 7, wherein at least one of the first and the second passages includes therein a bundle of channels.

14. A laser engraving system for manufacturing a device including a working area, the laser engraving system comprising:
    a laser beam outlet providing therethrough a laser beam to the working area; and
    a medium providing device including a first passage, a second passage and a bridging part connected therebetween for providing a medium onto the working area via the first passage and collecting the medium from the working area via the second passage.

15. The laser engraving system as claimed in claim 13, wherein a flow rate of the medium is in a range of from about 20 ml/min to about 800 ml/min.

16. The laser engraving system as claimed in claim 13, wherein a wavelength of the laser beam is in a range of from about 355 nm to about 1064 nm.

17. The laser engraving system as claimed in claim 13, wherein a power of the laser beam is in a range of from about 0.5 W to about 200 W.

18. The laser engraving system as claimed in claim 13, wherein a density of the medium is configured to carry debris from the working area to the second passage.

19. The laser engraving system as claimed in claim 13, wherein a temperature of the medium providing from the first passage is configured to be lower than a temperature of the medium at the working area.

20. The laser engraving system as claimed in claim 13, wherein the device comprises printing plates, microelectronic probes, MEMS metal structure, semiconductors, ceramics, glass, polymer, and combinations thereof.

* * * * *